(12) United States Patent
Tokuda

(10) Patent No.: US 10,243,173 B2
(45) Date of Patent: Mar. 26, 2019

(54) DISPLAY DEVICE

(71) Applicant: Japan Display Inc., Tokyo (JP)

(72) Inventor: Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/810,597

(22) Filed: Nov. 13, 2017

(65) Prior Publication Data

US 2018/0138458 A1    May 17, 2018

(30) Foreign Application Priority Data

Nov. 16, 2016 (JP) .................................. 2016-223243

(51) Int. Cl.
*H01L 51/52* (2006.01)
*H01L 27/32* (2006.01)

(52) U.S. Cl.
CPC ...... *H01L 51/5275* (2013.01); *H01L 27/3246* (2013.01); *H01L 51/524* (2013.01); *H01L 51/5253* (2013.01); *H01L 51/5271* (2013.01); *H01L 51/5281* (2013.01); *H01L 51/5284* (2013.01); *H01L 27/3244* (2013.01); *H01L 2251/301* (2013.01); *H01L 2251/303* (2013.01)

(58) Field of Classification Search
CPC ............... H01L 51/5275; H01L 51/524; H01L 51/5253; H01L 51/5271; H01L 51/5281; H01L 51/5284; H01L 27/3244; H01L 2251/301; H01L 2251/303
See application file for complete search history.

(56) References Cited

U.S. PATENT DOCUMENTS

| | | | | |
|---|---|---|---|---|
| 2004/0195965 A1* | 10/2004 | Yamazaki | ........... | H01L 51/5016 313/506 |
| 2015/0001474 A1* | 1/2015 | Park | .................... | H01L 51/5271 257/40 |
| 2015/0090991 A1* | 4/2015 | Ishii | ...................... | H01L 51/525 257/40 |

FOREIGN PATENT DOCUMENTS

JP          2005-100789 A      4/2005

* cited by examiner

*Primary Examiner* — Sitaramarao S Yechuri
(74) *Attorney, Agent, or Firm* — Typha IP LLC

(57) ABSTRACT

A display device includes a first substrate, a light-emitting element over the first substrate, a sealing film over the light-emitting element, a first insulating layer over the sealing film, a second insulating layer over the sealing film, a light-shielding layer over the second insulating layer, and a second substrate over the light-shielding layer. The first insulating layer has an opening in a region thereof overlapping a light-emitting region of the light-emitting element. The second insulating layer has an inverted-conical or inverted-pyramidal depression above the light-emitting region of the light-emitting element. The light-shielding layer is located in a region overlapping the light-emitting region of the light-emitting element.

15 Claims, 19 Drawing Sheets

DISPLAY DEVICE

CROSS-REFERENCE TO RELATED APPLICATIONS

This application is based upon and claims the benefit of priority from the prior Japanese Patent Application No. 2016-223243, filed on Nov. 16, 2016, the entire contents of which are incorporated herein by reference.

FIELD

The present invention relates to configurations of display devices and, in particular, to a configuration of a pixel of a display device.

BACKGROUND

An organic electroluminescence (hereinafter referred to as "organic EL") display device has light-emitting elements provided in each separate pixel and displays an image by individually controlling the emission of light. Each of the light-emitting elements is structured such that a layer containing an organic EL material (such a layer being hereinafter also referred to as "light-emitting layer") is sandwiched between a pair of electrodes one of which is an anode and the other of which is a cathode. The injection of electrons into the light-emitting layer through the cathode and the injection of holes into the light-emitting layer through the anode cause the electrons and the holes to recombine with each other. This discharges excess energy that excites luminescent molecules in the light-emitting layer, and then the luminescent molecules are deexcited to emit light.

A mainstream structure of an organic EL display device is such that the anode of each of the light-emitting elements is provided as a pixel electrode for each pixel, and the cathodes are provided, for example, across the plurality of pixels as a common electrode to which a common potential is applied. The organic EL display device controls the emission of light from the pixels by applying the potential of the pixel electrode for each pixel with respect to the potential of the common electrode. The organic EL display device displays an image by causing the light from the pixels to exit through a counter substrate.

In such a structure, when light incident from outside penetrates into a panel through the counter substrate, the extraneous light is reflected by the reflecting electrodes of the pixels. Such reflections of the extraneous light undesirably make it difficult to view a display image.

Disclosed to address such a problem are a structure in which a circularly polarizing plate is bonded to a substrate to prevent reflections of extraneous light and a structure in which a reflecting member (reflective polarizing plate) is disposed on a side of a display surface that faces a light-emitting element (see, for example, Japanese Patent Application Publication No. 2005-100789).

SUMMARY

A display device in an embodiment according to the present invention includes a first substrate, a light-emitting element over the first substrate, a sealing film located over the light-emitting element and covering the light-emitting element, a first insulating layer over the sealing film, a second insulating layer over the sealing film, and a light-shielding layer overlapping the second insulating layer in a plan view. The first insulating layer has an opening in a region thereof overlapping a light-emitting region of the light-emitting element in a plan view, the light-emitting region being exposed through the opening. At least a part of the second insulating layer is located in the opening. The second insulating layer has a depression in a first region thereof overlapping the light-emitting region in a plan view. The light-shielding layer is located in a second region overlapping the light-emitting region of the light-emitting element in a plan view.

Further, a display device in an embodiment according to the present invention includes a first substrate, a plurality of light-emitting elements over the first substrate, a sealing film located over the light-emitting elements and covering the plurality of light-emitting elements, a first insulating layer over the sealing film, a second insulating layer over the sealing film, a light-shielding layer overlapping the second insulating layer in a plan view, and a second substrate over the light-shielding layer. The first insulating layer has a plurality of openings. Each of the plurality of openings overlaps a light-emitting region of a corresponding one of the plurality of light-emitting elements in a plan view and exposes the light-emitting region. At least a part of the second insulating layer is located in the opening. The second insulating layer has an inverted-conical or inverted-pyramidal depression in each region thereof overlapping a corresponding one of the light-emitting regions in a plan view. The light-shielding layer has a first region located in a region overlapping the light-emitting region. The light-shielding layer has a second region located in a region between adjacent ones of the plurality of light-emitting elements.

Further, a display device in an embodiment according to the present invention includes a first substrate, a light-emitting element over the first substrate, a sealing film located over the light-emitting element and covering the light-emitting element, a first insulating layer over the sealing film, a second insulating layer over the sealing film, a light-shielding layer overlapping the second insulating layer in a plan view, and a second substrate over the light-shielding layer. The first insulating layer has an opening in a region thereof overlapping a light-emitting region of the light-emitting element in a plan view, the light-emitting region being exposed through the opening. At least a part of the second insulating layer is located in the opening. The second insulating layer has an inverted-conical or inverted-pyramidal depression in a region thereof overlapping the light-emitting region in a plan view. The light-shielding layer is located in a region overlapping the light-emitting region of the light-emitting element in a plan view. The second insulating layer has a first inclined surface constituting a half angle of the inverted-conical or inverted-pyramidal depression. The first insulating layer has a second inclined surface in the opening. The first inclined surface totally reflects light emitted vertically upward from the light-emitting element. The second inclined surface has a first region that totally reflects light horizontally incident from the first inclined surface and a second region that transmits the light totally reflected by the first inclined surface. A width of the first region as viewed in cross-section is larger than a width of the second region as viewed in cross-section.

Further, a display device in an embodiment according to the present invention includes a first substrate, a light-emitting element over the first substrate, a sealing film located over the light-emitting element and covering the light-emitting element, a first insulating layer over the sealing film, a second insulating layer over the sealing film, a light-shielding layer overlapping the second insulating layer in a plan view, and a second substrate over the light-shielding layer. The first insulating layer has an opening in a region thereof overlapping a light-emitting region of the light-emitting element. The second insulating layer has an inverted-conical or inverted-pyramidal depression above the light-emitting region of the light-emitting element. The light-shielding layer is so located in a region overlapping the light-emitting region of the light-emitting element in a plan view as to expose the light-emitting region. At least a part of the second insulating layer is located in the opening. The second insulating layer has a first inclined surface constituting a half angle of the inverted-conical or inverted-pyramidal depression. The first insulating layer has a second inclined surface in the opening. The second inclined surface has a first region that totally reflects light incident vertically downward from outside and a second region that transmits the light incident vertically downward from outside. A first width of the first region as viewed in cross-section is smaller than a second width of the second region as viewed in cross-section.

DESCRIPTION OF EMBODIMENTS

Figure 1:
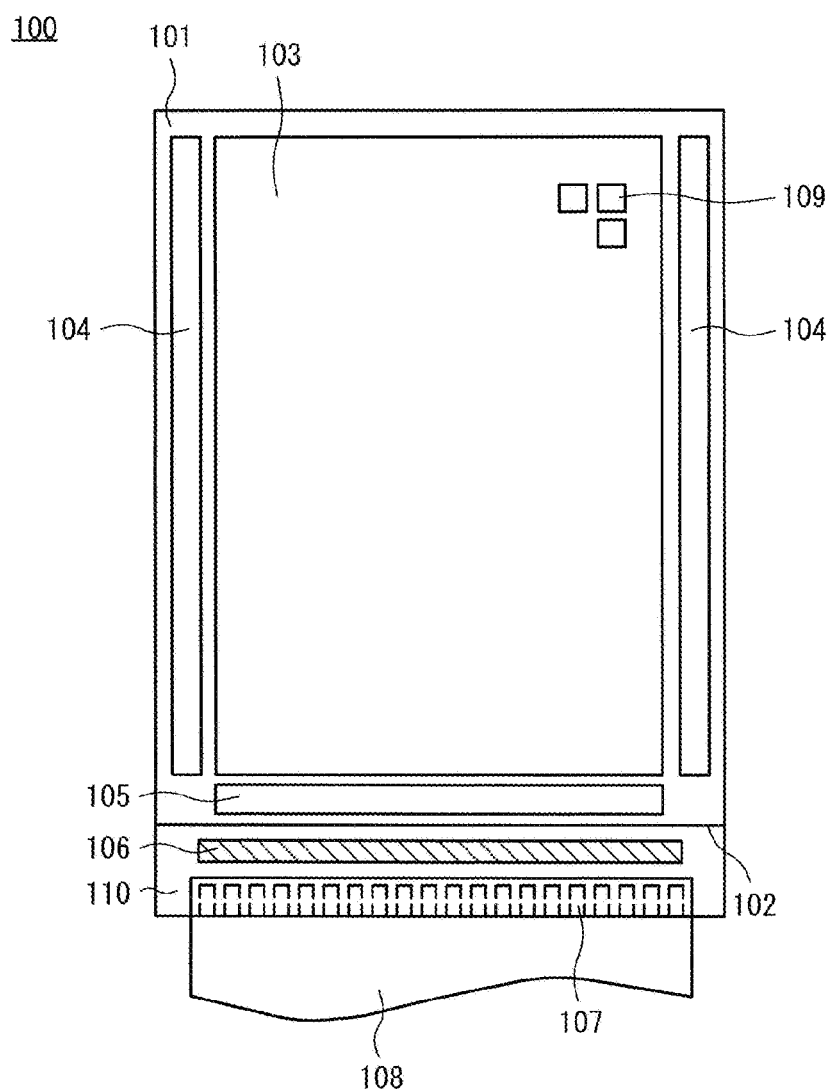
FIG. 1 is a schematic view illustrating a configuration of a display device according to an embodiment of the present invention.

In the case of a structure in which a circularly polarizing plate is attached to a display panel, the light transmittance of the circularly polarizing plate is theoretically 50% or less. For this reason, light extraction loss of the light emitting element occurs, which causes a problem that luminance is lowered.

The present invention has as an object to provide a display device with improved efficiency in light extraction. Further, the present invention has as another object to provide a display device with reduced intrusion and reflections of extraneous light.

Embodiments of the present invention will be described below with reference to the accompanying drawings and the like. Note, however, that the present invention can be carried out in many different modes without departing from the scope thereof and should not be interpreted by only the written contents of embodiments exemplified below. In addition, for the sake of clearer explanation, the drawings sometimes show each portion more schematically than in actual modes in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description will be omitted.

In the present invention, a plurality of films formed by processing one film may have different functions and roles. However, these films are derived from a film formed as the same layer in the same process and have the same layer structure and the same material. Therefore, these films are defined as being present in the same layer.

It should be noted that, in this specification, the terms such as "up" and "down" in the description of the drawings express a relative positional relationship between a structural body of interest and another structural body. In this specification, the term "up" is defined as a direction from the after-mentioned insulating surface toward a bank in a side view and the term "down" is defined as a direction opposite thereto. In this specification and the claims, unless otherwise noted, the term "over", when simply written in expressing an aspect in which a first structural body is disposed over a second structural body, encompasses both a case where the first structural body is disposed immediately over the second structural body in such a manner as to touch the second structural body and a case where the first structural body is disposed above the second structural body with a third structural body sandwiched therebetween.

First Embodiment

A configuration of a display device according to the present embodiment and a method for manufacturing the same are described with reference to FIGS. 1 to 15.

<Configuration>

FIG. 1 is a schematic view showing a configuration of a display device 100 according to an embodiment of the present invention, and schematically shows the configuration of the display device 100 as seen in a plan view. In this specification, a view of the display device 100 from a direction perpendicular to a screen (display region) is called "plan view".

As shown in FIG. 1, the display device 100 has, over an insulating surface, a display region 103, a peripheral region 110 located around the display region 103, a scanning line driving circuit 104, a data line driving circuit 105, and a driver IC 106. The driver IC 106 functions as a control section that supplies signals to the scanning line driving circuit 104 and the data line driving circuit 105. Alternatively, the data line driving circuit 105 may be incorporated in the driver IC 106. The driver IC 106 may be disposed over a first substrate 101 in the form of an IC chip or the like, or may be externally attached by being provided in a flexible printed circuit (FPC) 108. The FPC 108 is connected to terminals 107 provided in the peripheral region 110.

Note here that the insulating surface is a surface of the first substrate 101. The first substrate 101 supports layers such as pixel electrodes and insulating layers that are provided over the surface of the first substrate 101. It should be noted that the first substrate 101 may have its insulating surface by being made of an insulating material itself, or may have its insulating surface formed by forming a separate insulating film over the first substrate 101. As long as the insulating surface is obtained, the first substrate 101 and the insulating film may be made of any material. Further, a second substrate 102 is disposed opposite the first substrate 101.

In the display region 103 shown in FIG. 1, a plurality of pixels 109 are arranged in a matrix. Each of the pixels 109 includes a light-emitting element composed of a pixel electrode, an organic layer (light-emitting section) including a light-emitting layer stacked on the pixel electrode, and a common electrode (cathode). The pixels 109 are supplied with data signals corresponding image data from the data line driving circuit 105. Transistors electrically connected to the pixel electrodes of the pixels 109 are driven in accordance with these data signals, so that an image display corresponding to the image data can be performed. As the transistors, typically, thin-film transistors (TFTs) can be used. Note, however, that any elements may be used instead of the thin-film transistors, provided the elements have a current control function.

The configuration of the display device 100 according to the present embodiment is described in detail with reference to FIGS. 2 to 9.

Figure 2:
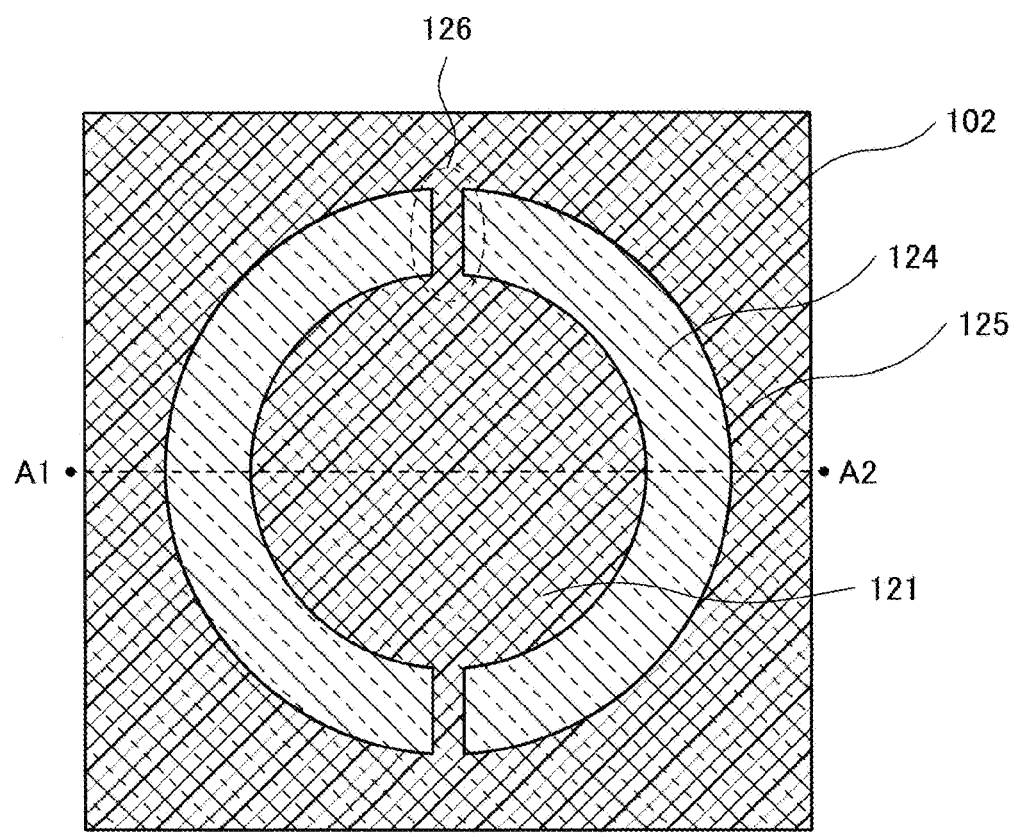
FIG. 2 is a schematic view of a display device according to an embodiment of the present invention as seen in a plan view.
Figure 3:
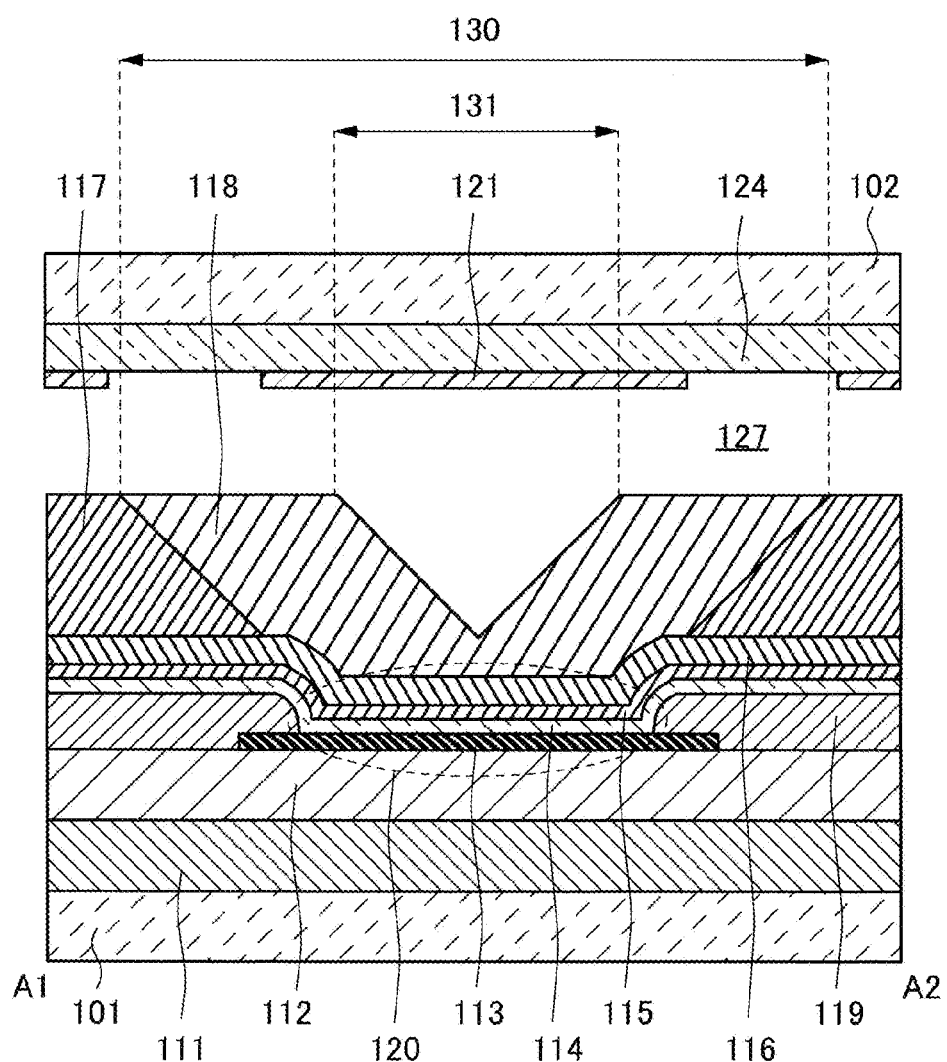
FIG. 3 is a cross-sectional view taken along line A1-A2 in FIG. 2.

FIG. 2 schematically shows the configuration of the display device 100 as seen in a plan view of a pixel of the display device 100, and FIG. 3 is a cross-sectional view taken along line A1-A2 in FIG. 2. As shown in FIG. 2, the second substrate 102 is provided with a colored layer 124 and a light-shielding layer 121, and the light-shielding layer 121 has apertures 125. The light-shielding layer 121 is provided in such a manner as to overlap a light-emitting region of the light-emitting element, and light from the light-emitting element exits through the apertures 125 of the light-shielding layer 121. Further, the light-shielding layer 121 is connected to adjacent pixels by junctions 126. In a case where the light-shielding layer 121 is provided with no junctions 126, the light-shielding layer 121 is separated into circles, so that the light-shielding layer 121 may peel. Therefore, by providing a circular light-shielding layer 121 with junctions and connecting it to adjacent pixels, the light-shielding layer 121 can be prevented from peeling.

As shown in FIG. 3, the display device 100 includes at least a pixel electrode 113, a bank 119, a light-emitting layer 114, a common electrode 115, a sealing film 116, and an insulating layer 117, and an insulating layer 118. Further, a light-emitting element 120 includes the pixel electrode 113, the light-emitting layer 114, and the common electrode 115. It should be noted that, in this specification, the light-emitting region refers to a region in an opening of the bank 119 where a region through which the pixel electrode 113 is exposed and the light-emitting layer 114 overlap.

An insulating layer 111 is provided over the first substrate 101. The insulating layer 111 includes an insulating layer that functions as a foundation for the transistors and an insulating layer covering the transistors and wires. Further, it is preferable that an insulating layer 112 provided over the first insulating layer 111 bury asperities on the insulating layer 111 entailed by the shapes of the transistors, the wires, and the like and have a substantially flat shape.

The pixel electrode 113 is provided over the insulating layer 112, and is connected to a corresponding one of the transistors. Further, the pixel electrode 113 is independently provided for each pixel. Further, the pixel electrode 113 contains a light reflective material. This causes light emitted by an organic EL layer to exit toward the second substrate 102, i.e. toward a display surface, without propagating toward the first substrate 101.

The bank 119 is provided so that its ends surround the outer edge of the pixel electrode 113. It is preferable that the bank 119 be made of an insulating material, as it serves to insulate adjacent pixels from each other by preventing the light-emitting layer 114 from being short-circuited with the common electrode 115 without being sufficiently covered at the ends of the pixel electrode 113. It is preferable that the bank 119 be made, for example, of an organic material such as polyimide or acrylic or an inorganic material such as silicon oxide. A preferred film thickness of the bank 119 ranges from 1 μm to 5 μm.

The light-emitting layer 114 is provided over at least the pixel electrode 113. In this example, the light-emitting layer 114 is commonly provided for the plurality of pixels 109, and is provided in such a manner as to cover the banks 119 between the pixel electrodes 113 and the pixels 109.

In a case where the light-emitting layer 114 is constituted, for example, by an organic EL layer, the light-emitting layer 114 is made of a low-molecular or high-molecular organic material. In a case where the light-emitting layer 114 is made of a low-molecular organic material, the light-emitting layer 114 is configured to include, in addition to a light-emitting layer 114 containing a luminescent organic material, a hole-injection layer and an electron-injection layer, and, furthermore, a hole-transport layer, an electron-transport layer, and the like so that the light-emitting layer 114 is sandwiched. In the present embodiment, the light-emitting layer 114 used is one that exhibits white light emission, and achieves full-color light emission through a color filter (colored layer 124). It should be noted that the light-emitting layer 114 used may alternatively be configured to be painted for each pixel as one that exhibits red light emission, one that exhibits green light emission, and one that exhibits blue light emission. In this case, the color filter (colored layer 124) may be omitted.

The common electrode 115 is provided over the light-emitting layer 114. Further, the common electrode 115 has translucency to transmit light emitted by the light-emitting layer 114. It is preferable that the common electrode 115 be formed by a transparent conducive film made of a material such as ITO (indium tin oxide) or IZO (indium zinc oxide), as these materials have both transparency and electrical conductivity. Alternatively, the common electrode 115 may be formed by a metal layer having such a film thickness as to be able to transmit the light emitted by the light-emitting layer 114.

The sealing film 116 is provided over the common electrode 115 in such a manner as to extend over the plurality of pixels 109, and covers a plurality of the light-emitting elements 120. The sealing film 116 is provided to prevent moisture from entering the light-emitting layer of the light-emitting elements 120. As the sealing film 116, a single layer or multilayer of an inorganic material and an organic material can be used. It should be noted that although the present embodiment describes a configuration in which the sealing film 116 is provided, a configuration in which the sealing film 116 is not provided may be adopted.

The insulating layer 117 is provided over the sealing film 116, and has an opening 130. The opening 130 is provided for each pixel 109, and is provided in a region overlapping a light-emitting region of the light-emitting element 120. Further, the insulating layer 117 has an inclined surface in the opening 130.

The insulating layer 118 is provided above the light-emitting element 120, and has an inverted-conical depression 131. The depression 131 is provided for each pixel 109, and is provided above the light-emitting region of the light-emitting element 120. Further, the insulating layer 118 has an inclined surface constituting the half angle of the inverted-conical depression 131.

Note here that in order for light emitted from the light-emitting elements 120 to be totally reflected by the insulating layer 118 and the insulating layer 117, it is preferable that the refractive index of the insulating layer 117 be lower than the refractive index of the insulating layer 118. In this case, it is preferable that the insulating layer 117 be made, for example, of silicon oxide, organic resin, or the like or contain silicon oxide or organic resin, and it is preferable that the insulating layer 118 be made of a silicon nitride film or include a silicon nitride film.

Provided above the insulating layer 117 and the insulating layer 118 is a filler 127 (also referred to as "filling material") that functions as an adhesive and a protective material. As the filler 127, a polyimide, polyamide, acrylic, epoxy, or siloxane resin material can be used. Meanwhile, hollow sealing can be adopted instead of using the filler 127, provided the area around the substrate can be sufficiently sealed and the gap between the first substrate 101 and the second substrate 102 can be kept.

Further, the second substrate 102 is provided in such a position as to face the first substrate 101 with the filler 127 sandwiched therebetween. The second substrate 102 is provided with the light-shielding layer 121 and the colored layer 124. The light-shielding layer 121 is provided over the insulating layer 118 over the first substrate 101, i.e. in such a position as to overlap the insulating layer 118 in a plan view. Further, the light-shielding layer 121 is located in a region overlapping the light-emitting region of the light-emitting element 120 over the first substrate 101 in a plan view. The light-shielding layer 121 is made of black resin containing carbon black. It should be noted that the light-shielding layer 121 may have a reflective metal film formed on a surface thereof that faces the light-emitting element 120. Although, in FIG. 3, the colored layer 124 and the light-shielding layer 121 are stacked so that the colored layer 124 is stacked on the second substrate 102 and the light-shielding layer 121 is stacked on the colored layer 124, they may alternatively be stacked so that the light-shielding layer 121 is stacked on the second substrate 102 and the colored layer 124 is stacked on the light-shielding layer 121.

Figure 4:
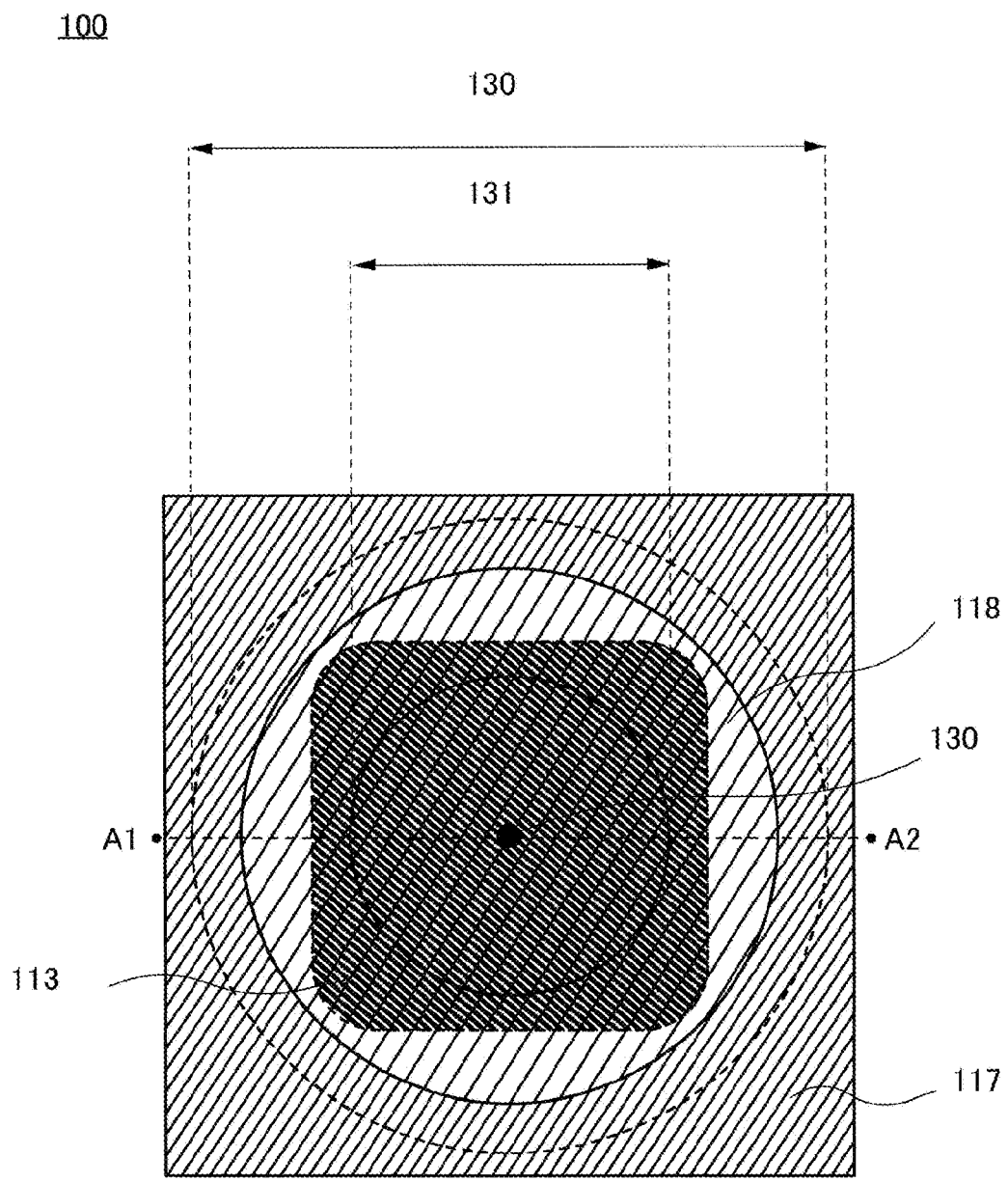
FIG. 4 is a schematic view of a display device according to an embodiment of the present invention as seen in a plan view.
Figure 5:
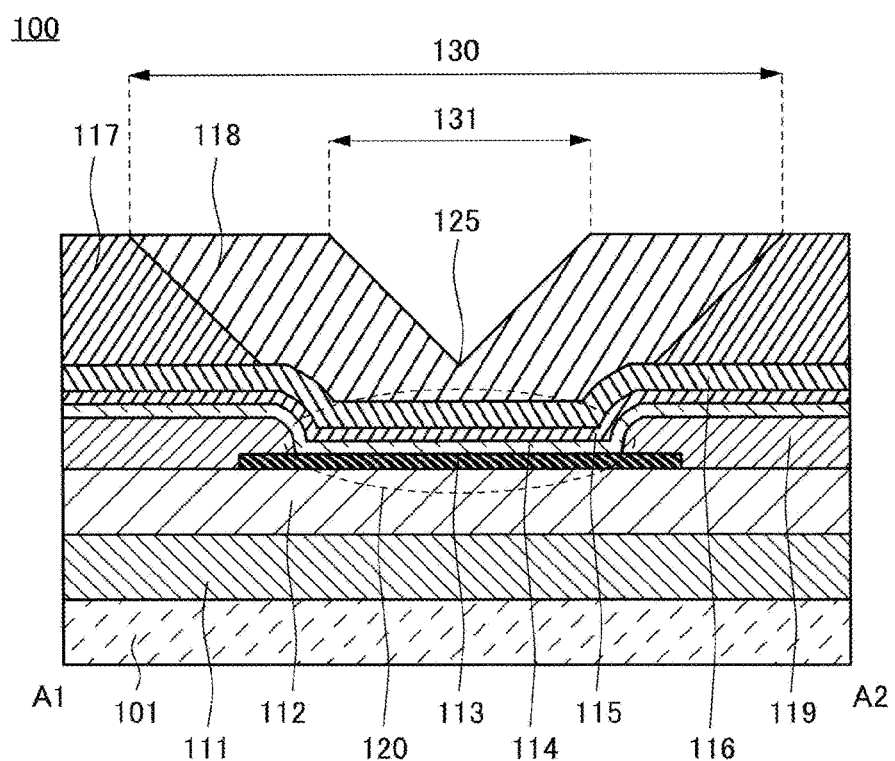
FIG. 5 is a cross-sectional view taken along line A1-A2 in FIG. 4.

FIG. 4 schematically shows the configuration of the display device 100 as seen in a plan view of a pixel of the display device 100, and FIG. 5 is a cross-sectional view taken along line A1-A2 in FIG. 4. As shown in FIG. 4, the insulating layer 117 has an opening 130, and the opening 130 overlaps the pixel electrode 113 of the light-emitting element 120. Further, the insulating layer 118 is provided in the opening 130 of the insulating layer 117. The insulating layer 118 is provided with an inverted-conical depression 131. In FIG. 4, the black circle represents the apex 130 of the inverted conical shape. It should be noted that although FIG. 4 illustrates a case where the depression 131 provided has an inverted conical shape, the depression 131 may alternatively have an inverted pyramidal shape. Further, although a case has been described where the opening 130 of the insulating layer 117 and the depression 131 of the insulating layer 118 are disposed in the center of the pixel, this does not imply any limitation. The opening 130 and the depression 131 may alternatively be disposed in a position displaced from the center of the pixel.

In a conventional display device, when light incident from outside penetrates into the panel through the counter substrate, the extraneous light is reflected by the reflecting electrodes of the pixels. This has made it difficult to view a display image. This is prevented by configuring the display device to be provided with a circularly polarizing plate. However, the transmittance of light through a circularly polarizing plate is theoretically 50% or lower. This causes a loss in extraction of light emitted by the light-emitting elements, undesirably resulting in lower luminance.

In view of this, as shown in FIG. 3, the light-shielding layer 121 is provided in a region overlapping the light-emitting region of the light-emitting element 120. As such, the light-shielding layer 121 makes it difficult, even if light incident from outside the display device penetrates into the panel through the second substrate 102, for the light to reach the reflecting electrode (here, the pixel electrode 113) of the pixel. This makes it possible to prevent the light from being reflected by the reflecting electrodes of the pixels, thus making it possible to prevent the extraneous light from making it difficult to view a display image. This makes it unnecessary to bond a circularly polarizing plate to the display device, thus making it possible to efficiently extract light emitted by the light-emitting elements and to improve the luminance.

Figure 6:
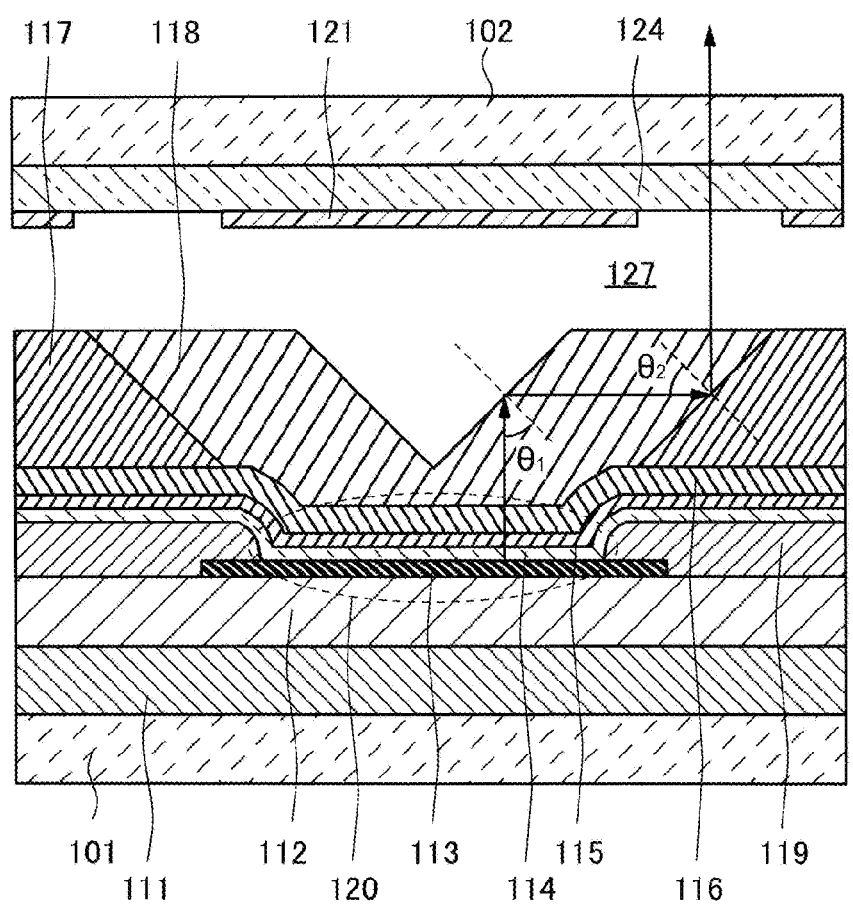
FIG. 6 is a diagram illustrating a configuration of a display device according to an embodiment of the present invention.

The inclined surface of the insulating layer 118 and the inclined surface of the insulating layer 117 are described here with reference to FIG. 6. It is preferable that, as indicated by an arrow in FIG. 6, the angle $\theta_1$ formed by the direction of incidence on the inclined surface of the insulating layer 118 of light emitted vertically upward from the light-emitting element 120 and the direction perpendicular to a tangent to the point of incidence of the light on the inclined surface of the insulating layer 118 be equal to or larger than the critical angle $\theta c$ at which the light emitted vertically upward from the light-emitting element 120 is totally reflected. Further, it is preferable that the angle $\theta_2$ formed by the direction of horizontal incidence on the inclined surface of the insulating layer 117 of the light totally reflected by the inclined surface of the insulating layer 118 and the direction perpendicular to a tangent to the point of incidence of the light on the inclined surface of the insulating layer 117 be equal to or larger than the critical angle $\theta c$ at which the light horizontally incident on the inclined surface of the insulating layer 117 is totally reflected.

Such a configuration as that described above allows the light emitted vertically upward from the light-emitting element 120 to be totally reflected by the inclined surface of the insulating layer 118 as shown in FIG. 6. Then, the light totally reflected by the inclined surface of the insulating layer 118 is horizontally incident on the inclined surface of the insulating layer 117, is totally reflected by the inclined surface of the insulating layer 117, and passes through the filler 127, the colored layer 124, and the second substrate 102.

By having such a configuration, the display device 100 allows the light emitted from the light-emitting element 120 to be totally reflected by the insulating layer 118 and the insulating layer 117 to be easily extracted in the direction of an arrow shown in FIG. 6, thus bringing about improvements in efficiency in light extraction and efficiency in light utilization. Improvements in efficiency in light extraction and efficiency in light utilization make it possible to output constant luminance with less electric power, thus leading to less power consumption.

Figure 7:
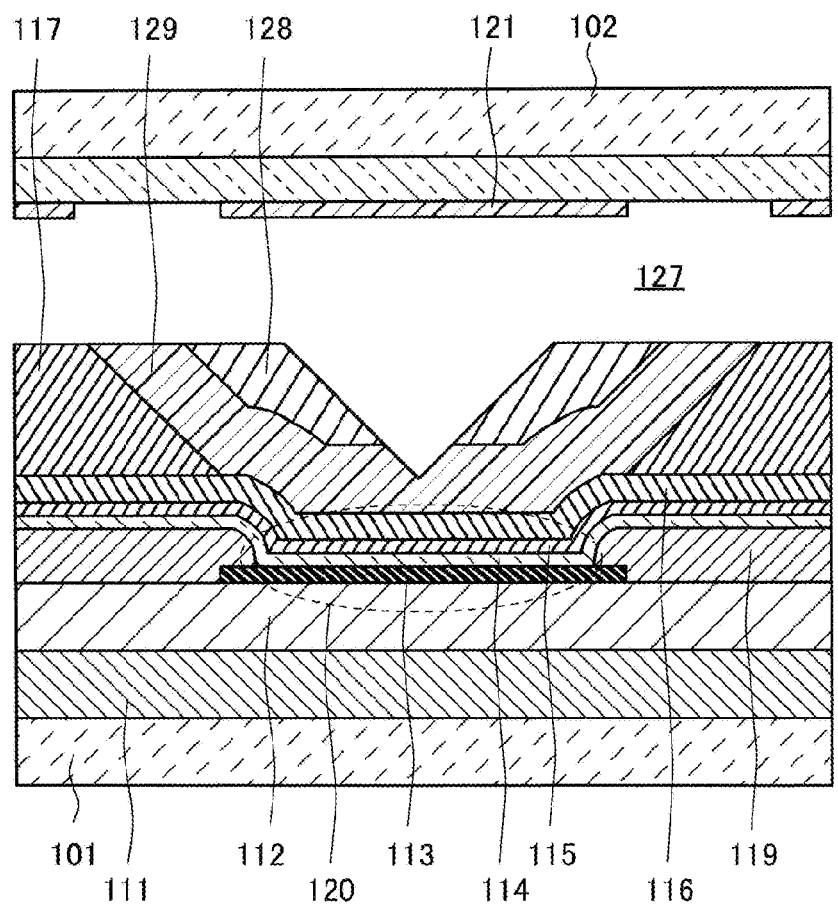
FIG. 7 is a diagram illustrating a configuration of a display device according to an embodiment of the present invention.

It should be noted that although the insulating layer 118 is shown as a single-layer configuration in FIGS. 3, 5, and 6, the insulating layer 118 may alternatively be configured such that its density (compactness of the layer, the density of a substance that constitutes the layer) becomes lower from a side touching the insulating layer 117 toward an inclined surface constituting the half angle of the inverted-conical or inverted-pyramidal depression 131 of the insulating layer 118. The insulating layer 118 may alternatively be configured such that its density becomes gradually lower from a side facing the sealing film 116 toward a side facing the light-shielding layer 121. Further, the insulating layer 118 may include a plurality of layers stacked on top of each other. For example, let it be assumed, as shown in FIG. 7, that the insulating layer 118 has a two-layer structure consisting of a first layer 129 and a second layer 128. In this case, the insulating layer 118 may be configured such that the density of the first layer 129 touching the sealing film 116 and the insulating layer 117 is higher than the density of the second layer 128 formed on the first layer 129.

Figure 19:
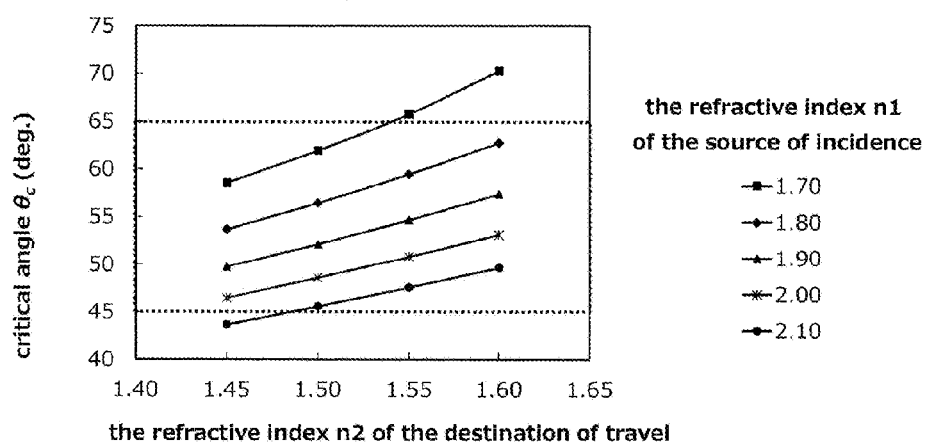
FIG. 19 is a graph showing a relationship between the refractive index of an insulating layer 117, the refractive index of an insulating layer 118, and the critical angle θc.

In order for the light emitted from the light-emitting element 120 to be totally reflected by the insulating layer 117 and the insulating layer 118, it is preferable that the refractive index of the insulating layer 117 be lower than the refractive index of the insulating layer 118. FIG. 19 shows a graph representing a relationship between the refractive index n1 of the source of incidence, the refractive index n2 of the destination of travel, and the critical angle θc. The vertical axis represents the critical angle θc, and the horizontal axis represents the refractive index n2. Further, as for the refractive index n1 of the source of incidence, the quadrangular, rhomboidal, triangular, x-mark, and circular plots represent refractive indices of 1.70, 1.80, 1.90, 2.00, and 2.10, respectively. It should be noted that the critical angle θc is expressed by the formula below. It should be noted that n1 is the refractive index of the insulating layer 118, which is the source of incidence, and n2 is the refractive index of the insulating layer 117, which is the destination of travel.

$$\theta c = \arcsin\frac{n2}{n1}$$

As shown in FIG. 19, it is preferable that the refractive index n1 of the insulating layer 118 range from 1.7 to 2.1, and it is preferable that the refractive index n2 of the insulating layer 117 range from 1.45 to 1.60. More preferably, the refractive index n1 of the insulating layer 118 and the refractive index n2 of the insulating layer 117 are set so that the critical angle θc falls within the range of 45 degrees to 65 degrees. Further, in a case where the insulating layer 118 has a two-layer structure as shown in FIG. 7, it is preferable that the refractive indices of the first and second layers 129 and 128 range from 1.7 to 2.1 and the refractive index of the first layer 129 be lower than the refractive index of the second layer 128. It should be noted that in a case where the filler 127 is provided between the first substrate 101 and the second substrate 102, it is preferable that the refractive index of the filler 127 be lower than the refractive index of the insulating layer 118. The refractive index of the filler 127 may for example be 1.5.

Figure 8:
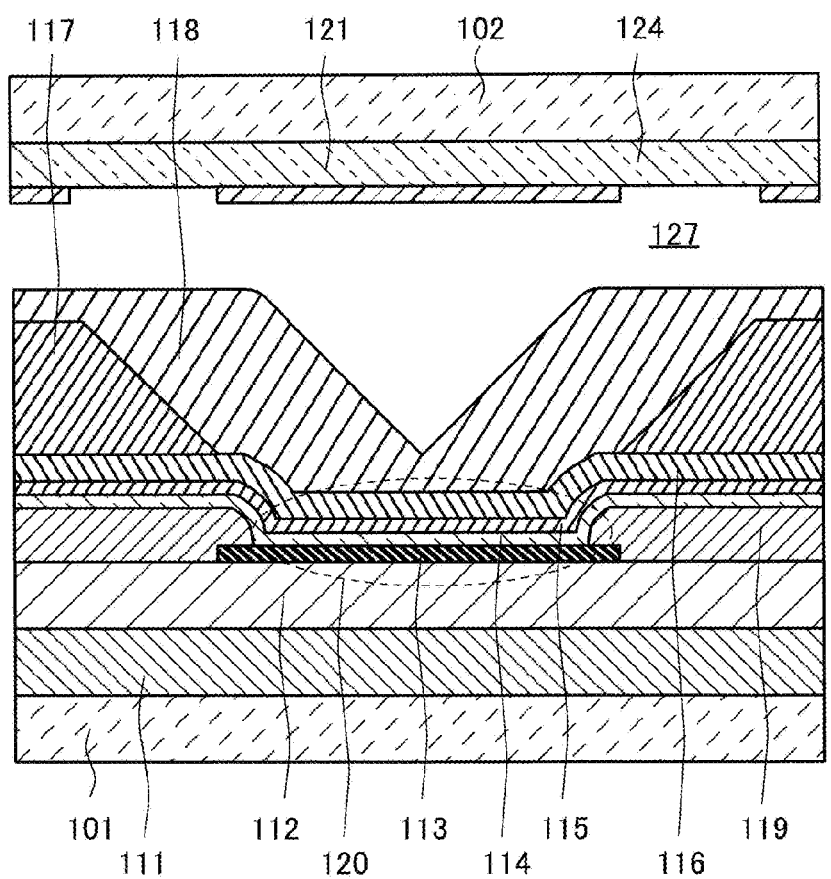
FIG. 8 is a diagram illustrating a configuration of a display device according to an embodiment of the present invention.

It should be noted that although FIGS. 3, 5, and 6 illustrate an example in which the insulating layer 118 is formed inside the opening 130 of the insulating layer 117, the present invention is not limited to this example. As shown in FIG. 8, the insulating layer 118 may be formed in such a manner as to cover the insulating layer 117.

Figure 9:
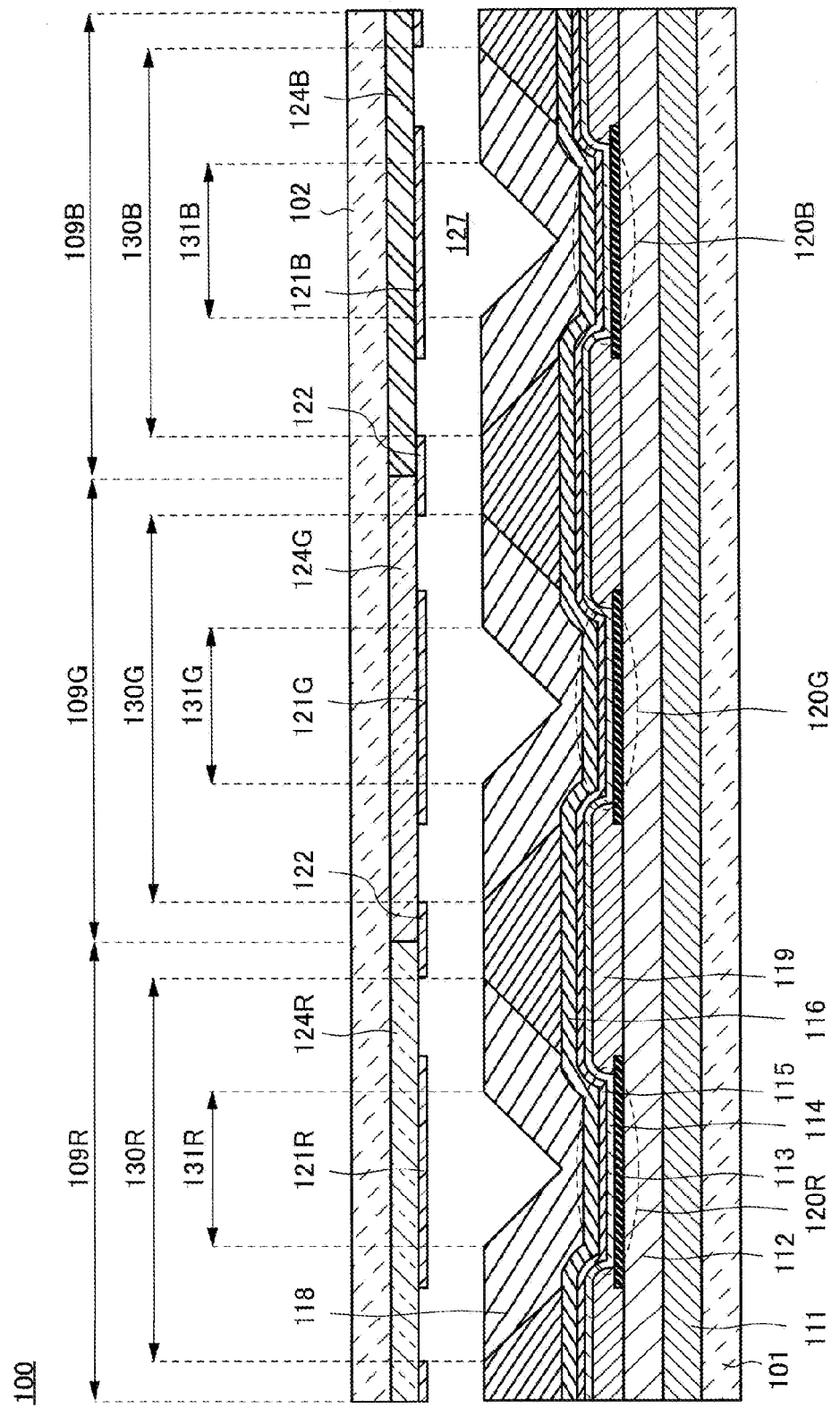
FIG. 9 is a diagram illustrating a configuration of a display device according to an embodiment of the present invention.

Next, a case where a plurality of pixels 109 are arranged in a column-wise direction in the display device 100 is shown in FIG. 9. FIG. 9 shows cross-sections of three pixels 109R, 109G, and 109B, namely a red (R) pixel, a green (G) pixel, and a blue (B) pixel.

Light-emitting elements 120R, 120G, and 120B are provided over the first substrate 101 with the insulating layers 111 and 112 sandwiched therebetween. Further, the sealing film 116 is provided over the light-emitting elements 120R, 120G, and 120B.

The insulating layer 117 is provided over the sealing film 116, and has openings 130R, 130G, and 130B provided in regions thereof overlapping the light-emitting elements 120R, 120G, and 120B, respectively.

The insulating layer 118 is provided over the sealing film 116 and the insulating layer 117, and has inverted-conical or inverted-pyramid depressions 131R, 131G, and 131B provided in regions thereof overlapping the light-emitting regions of the light-emitting elements 120R, 120G, and 120B, respectively.

The light-shielding layer has regions 121R, 121G, and 121B provided in regions overlapping the light-emitting regions of the light-emitting elements 120R, 120G, and 120B, respectively.

Further, the second substrate 102 is provided in such a position as to face the first substrate 101. The second substrate 102 is provided with the regions 121R, 121G, 121B, and 122 of the light-shielding layer and colored layers 124R, 124G, and 124B. The regions 121R, 121G, and 121B of the light-shielding layer are provided above the insulating layer 118 over the first substrate 101. Further, the regions 121R, 121G, and 121B of the light-shielding layer are located in regions overlapping the light-emitting regions of the light-emitting elements 120R, 120G, and 120B, respectively, over the first substrate 101.

The region 122 of the light-shielding layer is provided above the insulating layer 117 over the first substrate 101. Further, the region 122 of the light-shielding layer is located between adjacent ones of the plurality of light-emitting elements. For example, the region 122 of the light-shielding layer is located in a region between the light-emitting element 120R and the light-emitting element 120G and located between the light-emitting element 120R and the light-emitting element 120B. It is preferable that the region 122 of the light-shielding layer be provided in a region where the colored layer 124R and the colored layer 124G overlap each other and a region where the colored layer 124G and the colored layer 124B overlap each other. Such a configuration makes it possible to prevent light emitted by each light-emitting element from passing through a region where colored layers overlap each other.

The foregoing has described the structure of the display device 100 according to the present embodiment. The present embodiment makes it possible to provide a display device 100 with improved efficiency in light extraction.

<Manufacturing Method>

A method for manufacturing a display device 100 according to the present embodiment is described with reference to FIGS. 10 to 15.

Figure 10:
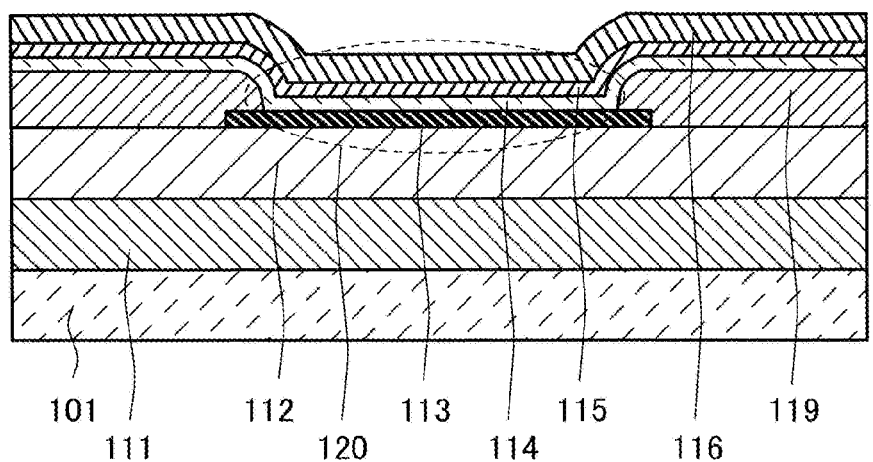
FIG. 10 is a diagram illustrating a process flow of a display device according to an embodiment of the present invention.

First, as shown in FIG. 10, the insulating layer 111 is formed over the first substrate 101, and the insulating layer 112 is formed over the insulating layer 111.

In a case where an inorganic insulating layer is used as the insulating layer 111, a film of silicon oxide (SiOx), silicon nitride (SiNx), silicon oxynitride (SiOxNy), silicon nitroxide (SiNxOy), aluminum oxide (Alox), aluminum nitride (AlNx), aluminum oxynitride (AlOxNy), aluminum nitroxide (AlNxOy), or the like can be used (x and y are arbitrary). Alternatively, a structure including these films stacked on top of each other may be used. As a deposition method, a plasma CVD method or a sputtering method can be used.

In a case where an organic insulating layer is used as the insulating layer 112, a film of polyimide resin, acrylic resin, epoxy resin, silicone resin, fluororesin, siloxane resin, or the like can be used. Alternatively, a structure including these materials stacked on top of each other may be used. As a deposition method, a vapor deposition method or a vapor deposition polymerization method can be used.

Next, the pixel electrode 113 is formed over the insulating layer 112. It is preferable that the pixel electrode 113 be formed by a high-reflectivity metal film in order to reflect light generated by the light-emitting layer 114 toward the common electrode 115. Alternatively, the pixel electrode 113 may be a laminated structure of a metal film and a transparent conductive film, and may be configured to include a light-reflecting surface. The pixel electrode 113 is formed for each pixel.

Next, the bank 119 is formed in such a manner as to cover the periphery of the pixel electrode 113. The bank 119 is formed, for example, of an organic material such as polyimide or acrylic to an inorganic material such as silicon oxide. It is preferable that the film thickness of the bank 119 range from 1 μm to 5 μm.

Next, the light-emitting layer 114 is formed over the pixel electrode 113. The light-emitting layer 114 is constituted, for example, by an organic EL layer. In the present embodiment, the light-emitting layer 114 used is one that exhibits white light emission, and is formed across the plurality of pixels.

Next, the common electrode 115 is formed over the light-emitting layer 114. The common electrode 115 is formed of a transparent conducive film across the plurality of pixels. All this makes it possible to form the light-emitting element 120.

Next, the sealing film 116 is formed over the common electrode 115. As the sealing film 116, a single layer or multilayer of an inorganic material and an organic material can be used, for example. In a case where an inorganic material is used, a film of silicon nitride (SixNy), silicon oxynitride (SiOxNy), silicon nitroxide (SiNxOy), aluminum oxide (AlxOy), aluminum nitride (AlxNy), aluminum oxynitride (AlxOyNz), aluminum nitroxide (AlxNyOz), or the like can be used (x, y, and z are arbitrary), for example. Further, in a case where an organic material is used, a film of polyimide resin, acrylic resin, epoxy resin, silicone resin, fluororesin, siloxane resin, or the like can be used. In a case where the sealing film 116 is a multilayer, it can be of a silicon nitride film, a silicon oxide film, acrylic, and a silicon nitride film. It is preferable that the sealing film 116 be a film having high barrier properties against moisture. By being formed by a film having high barrier properties against moisture, the sealing film 116 can prevent outside moisture having entered the display device 100 from entering the light-emitting layer 114. This in turn makes it possible to prevent the light-emitting element 120 from deteriorating.

Figure 11:
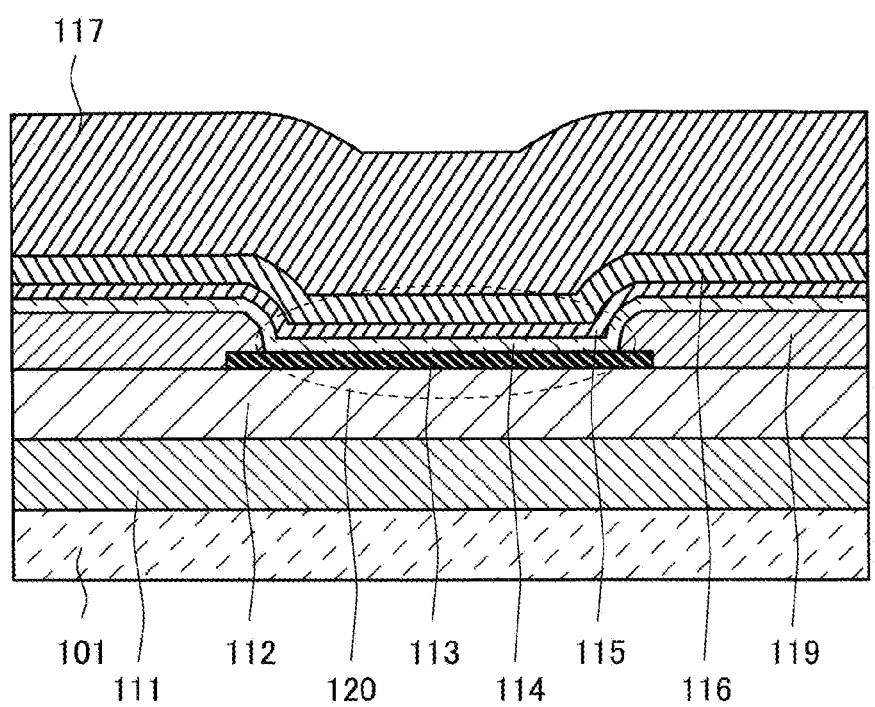
FIG. 11 is a diagram illustrating a process flow of a display device according to an embodiment of the present invention.

Next, as shown in FIG. 11, the insulating layer 117 is formed over the sealing film 116. The insulating layer 117 is formed, for example, of silicon oxide or an organic material (resin). Alternatively, the insulating layer 117 is formed to contain silicon oxide or an organic material (resin). Further, it is preferable that, as the material of which the insulating layer 117 is formed, a material having a refractive index of 1.45 to 1.60 be used.

Figure 12:
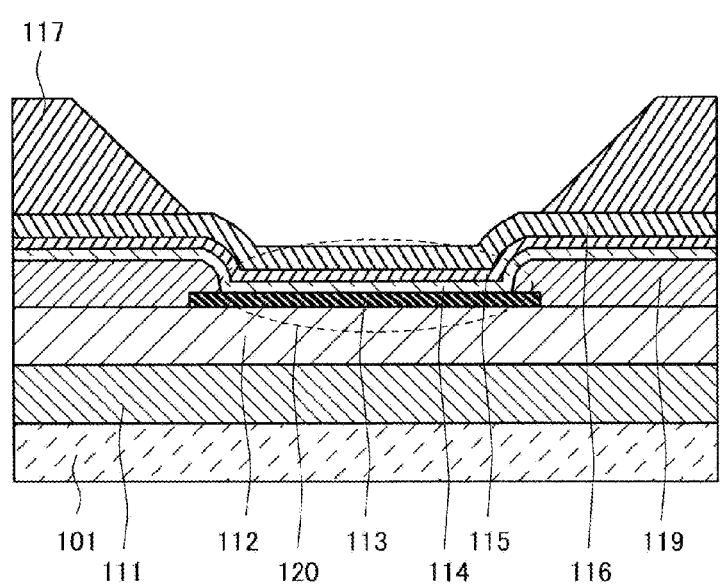
FIG. 12 is a diagram illustrating a process flow of a display device according to an embodiment of the present invention.

Next, as shown in FIG. 12, an opening 130 is formed in the insulating layer 117. For example, in a case where the insulating layer 117 is made of silicon oxide, the opening 130 can be tapered by forming, as the upper layer of the insulating layer 117, a film having a high etching rate. Alternatively, in a case where the insulating layer 117 is made of an organic material, the opening 130 can be tapered by performing development and post bake.

Figure 13:
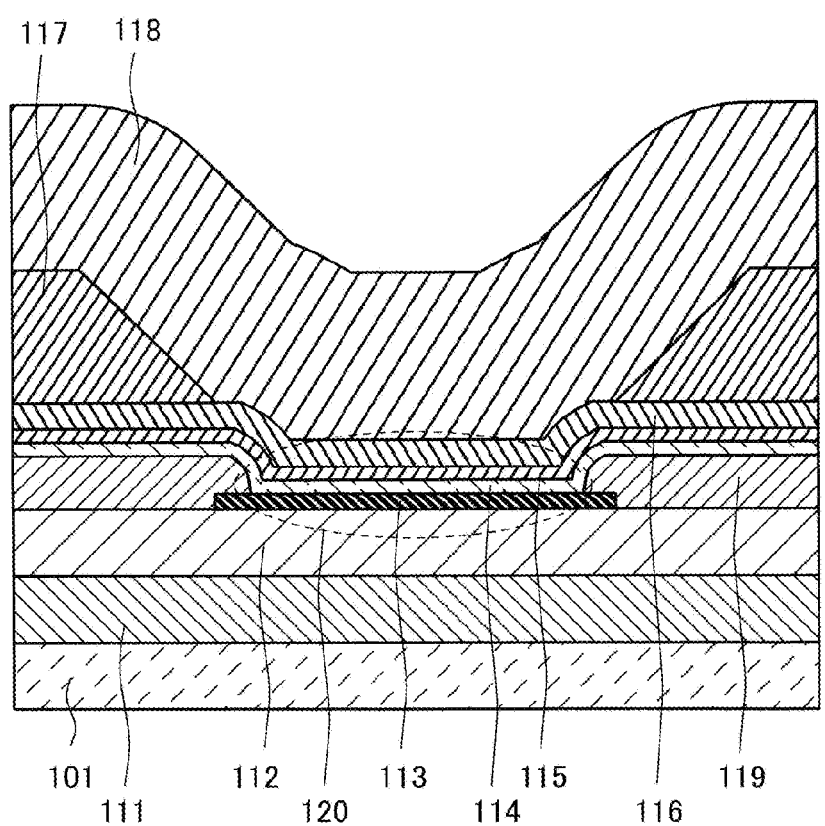
FIG. 13 is a diagram illustrating a process flow of a display device according to an embodiment of the present invention.

Next, as shown in FIG. 13, the insulating layer 118 is formed over the sealing film 116 and the insulating layer 117. It is preferable that the insulating layer 118 be formed of a material having a higher refractive index than that of the material of which the insulating layer 117 is formed. It is preferable that, as the material of which the insulating layer 118 is made, a material having a refractive index of 1.7 to 2.1 be used. The insulating layer 118 is for example formed of silicon nitride or formed to contain silicon nitride. The density of the insulating layer 118 can be changed in a film thickness direction by changing the flow ratio between a nitrogen-containing gas and a silicon-containing gas in depositing the insulating layer 118 by a CVD method. For example, by gradually reducing the flow rate of the silicon-containing gas after the start of the deposition of the insulating layer 118, the density of the insulating layer 118 can be made lower from the side touching the insulating layer 117 and the sealing film 116 toward the surface. Further, as the density of the insulating layer 118 decreases, the refractive index can decrease. Further, in a case where the insulating layer 118 is a multilayer as shown in FIG. 7, the first layer may be formed of the nitrogen-containing gas and the silicon-containing gas and then the second layer may be formed with a reduction in the flow rate of the silicon-containing gas. It should be noted that in a case where a silicon nitride film is used as the insulating layer 118, it may be formed by a coating method. The silicon nitride film formed by the coating method can have its surface planarized.

Figure 14:
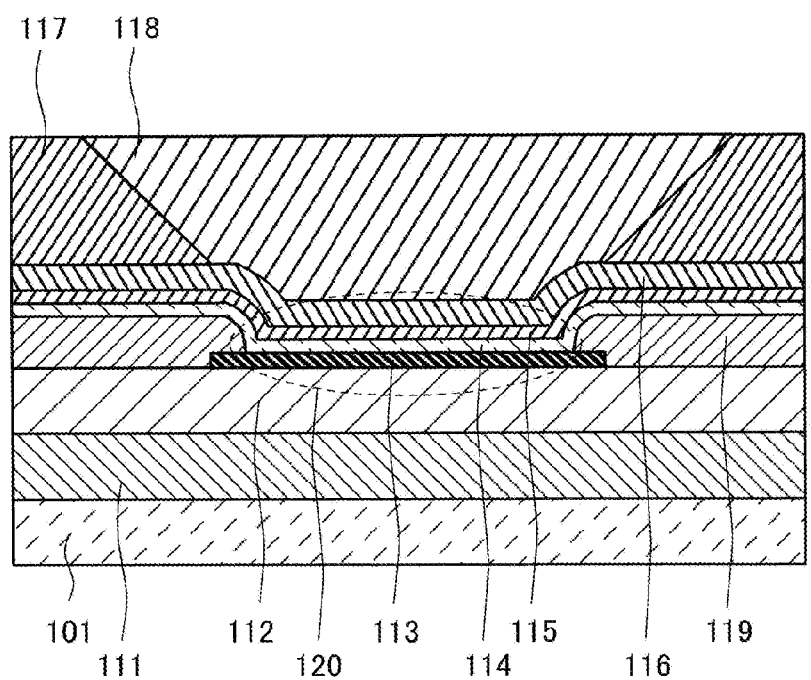
FIG. 14 is a diagram illustrating a process flow of a display device according to an embodiment of the present invention.

Next, as shown in FIG. 14, the surface of the insulating layer 118 is planarized. For example, the planarization of the surface of the insulating layer 118 is performed by performing an etching process on the insulating layer 118. Specifically, the surface of the insulating layer 118 is entirely ground in the thickness direction by anisotropic etching. As the etching process, over etching is performed so that the upper surface of the insulating layer 117 can be surely exposed. Further, the planarization of the surface of the insulating layer 118 may be performed by performing chemical mechanical polish on the insulating layer 118. It should be noted that in a case where the display device shown in FIG. 8 is manufactured, the surface of the insulating layer 117 does not necessarily need to be exposed.

Figure 15:
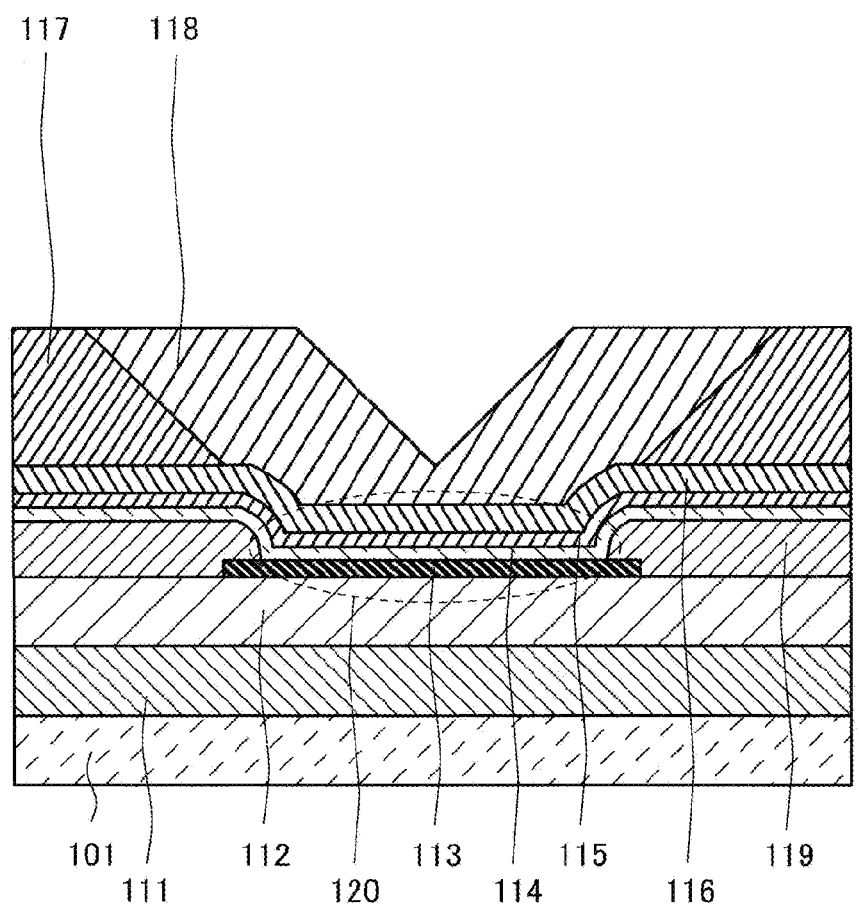
FIG. 15 is a diagram illustrating a process flow of a display device according to an embodiment of the present invention.

Next, as shown in FIG. 15, an inverted-conical or inverted-pyramid depression 131 is formed in the insulating layer 118 by etching the insulating layer 118. It should be noted that in a case where the insulating layer 118 has varied densities, the low-density silicon nitride is etched more quickly than the high-density silicon nitride.

Next, through the step of providing the second substrate 102 with the light-shielding layer 121 and the colored layer 124 and the step of bonding the first substrate 101 and the second substrate 102 together, the display device 100 shown in FIG. 3 can be manufactured.

The foregoing has described the method for manufacturing a display device 100 according to the present embodiment. The method for manufacturing a display device 100 according to the present embodiment makes it possible to provide a display device 100 with improved efficiency in light extraction. The method also makes it possible to provide a display device 100 with reduced intrusion and reflections of extraneous light.

Second Embodiment

Figure 16:
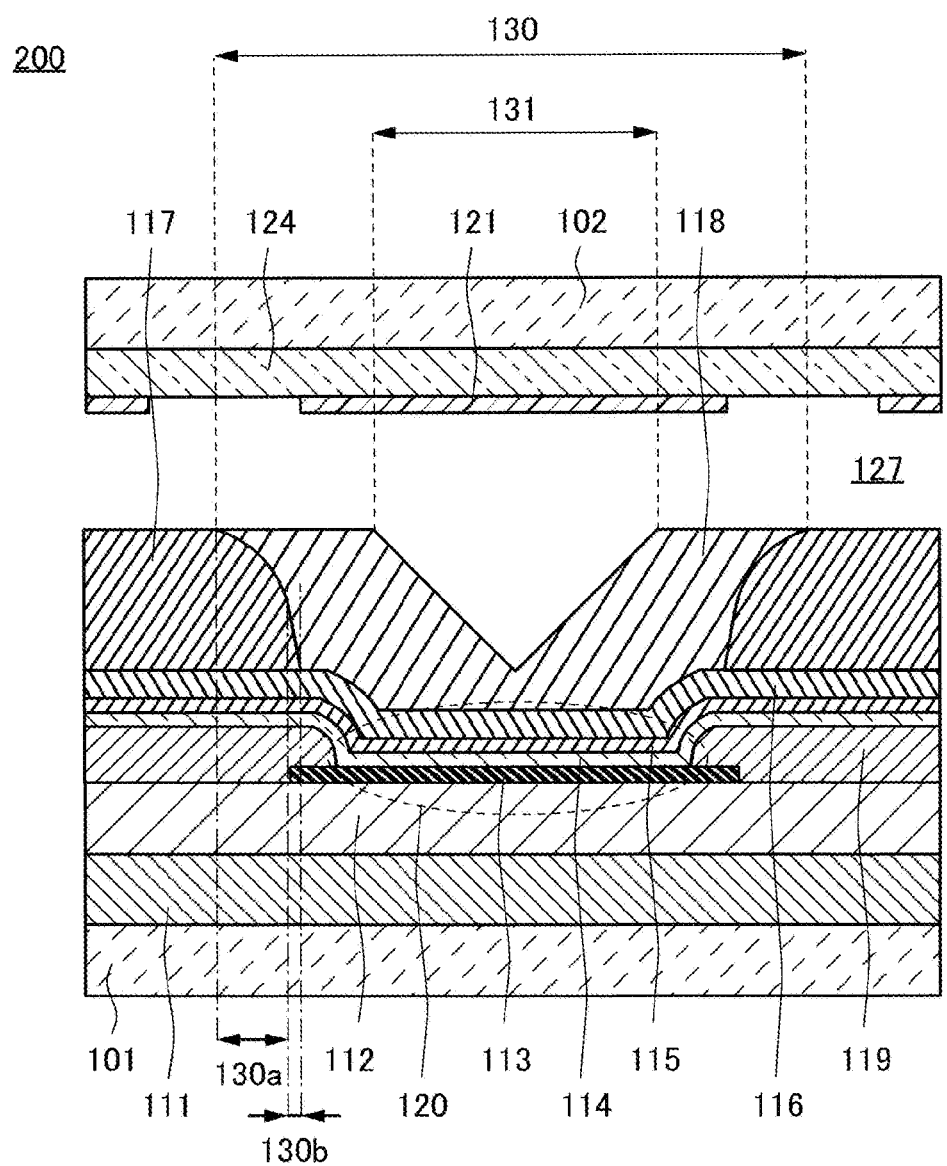
FIG. 16 is a diagram illustrating a configuration of a display device according to an embodiment of the present invention.

A configuration of a display device 200 according to the present embodiment is described with reference to FIGS. 16 to 18. FIG. 16 is a cross-sectional view showing the configuration of the display device 200 according to the present embodiment. It should be noted that the shape of the opening 130 of the insulating layer 117 is different from the shape of the opening 130 of the insulating layer 117 of the display device 100 according to the first embodiment. Accordingly, the present embodiment describes the opening 130 of the insulating layer 117 in detail and omits to describe the other components.

In the cross-sectional view shown in FIG. 16, the inclined surface of the opening 130 of the insulating layer 117 has a first region 130a and a second region 130b. The first region 130a is a region that causes the light totally reflected by the inclined surface of the insulating layer 118 to be totally reflected when the light is horizontally incident on the first region 130a. Further, the second region 130b is a region that causes the light totally reflected by the inclined surface of the insulating layer 118 to be transmitted when the light is horizontally incident on the second region 130b. The second region 130b, which transmits light, makes it difficult to extract light out of the display device. Therefore, it is preferable that the width of the first region 130a as viewed in cross-section be larger than the width of the second region 130b as viewed in cross-section.

Figure 17:
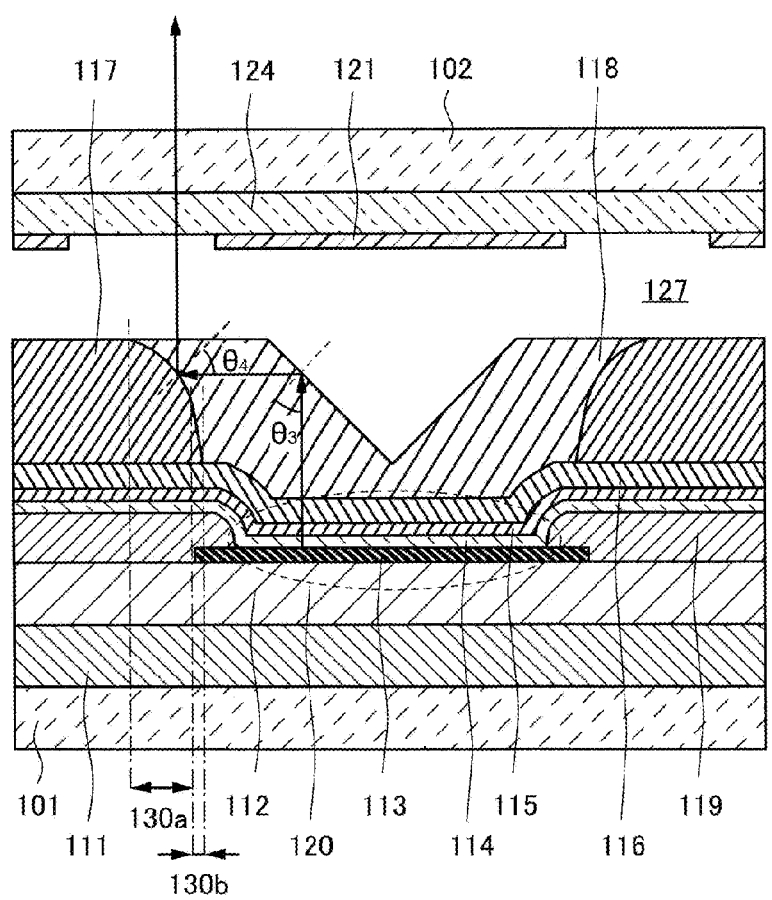
FIG. 17 is a diagram illustrating a configuration of a display device according to an embodiment of the present invention.

As shown in FIG. 17, it is preferable that the angle $\theta_3$ formed by the direction of incidence on the inclined surface of the insulating layer 118 of the light emitted vertically upward from the light-emitting element 120 and the direction perpendicular to a tangent to the point of incidence of the light on the inclined surface of the insulating layer 118 be equal to or larger than the critical angle $\theta c$ at which the light emitted vertically upward from the light-emitting element 120 is totally reflected. Further, it is preferable that the angle $\theta_7$ formed by the direction of horizontal incidence on the second region 130b of the insulating layer 117 of the light totally reflected by the inclined surface of the insulating layer 118 and the direction perpendicular to a tangent to the point of incidence of the light on the second region 130b of the insulating layer 117 be equal to or larger than the critical angle $\theta c$ at which the light horizontally incident on the second region 130b of the insulating layer 117 is totally reflected. Further, it is preferable that the angle $\theta_4$ formed by the direction of horizontal incidence on the first region 130a of the insulating layer 117 of the light totally reflected by the inclined surface of the insulating layer 118 and the direction perpendicular to a tangent to the point of incidence of the light on the first region 130a of the insulating layer 117 be smaller than the critical angle $\theta c$ at which the light horizontally incident on the first region 130a of the insulating layer 117 is totally reflected.

Such a configuration as that described above allows the light emitted vertically upward from the light-emitting element 120 to be totally reflected by the inclined surface of the insulating layer 118 as shown in FIG. 17. Then, the light totally reflected by the inclined surface of the insulating layer 118 is horizontally incident on the first region 130a of the insulating layer 117, is totally reflected by the first region 130a of the insulating layer 117, and passes through the colored layer 124 and the second substrate 102. It should be noted that in a case where the light totally reflected by the inclined surface of the insulating layer 118 is horizontally incident on the second region 130b of the insulating layer 117, the light passes through the insulating layer 117. The efficiency in the extraction of the light emitted by the light-emitting element 120 can be improved by configuring the insulating layer 117 such that the width of the first region 130a as viewed in cross-section is larger than the width of the second region 130b as viewed in cross-section.

The following describes a case where light is incident vertically downward from outside the display device 200. When light is incident vertically downward from outside the display device 200, the light-shielding layer 121 can prevent the light from being incident on the inside of the display device 200 in a region where the light-shielding layer 121 is present. Further, the light is incident on the inside of the display device 200 in a region where the light-shielding layer 121 is not present.

Figure 18:
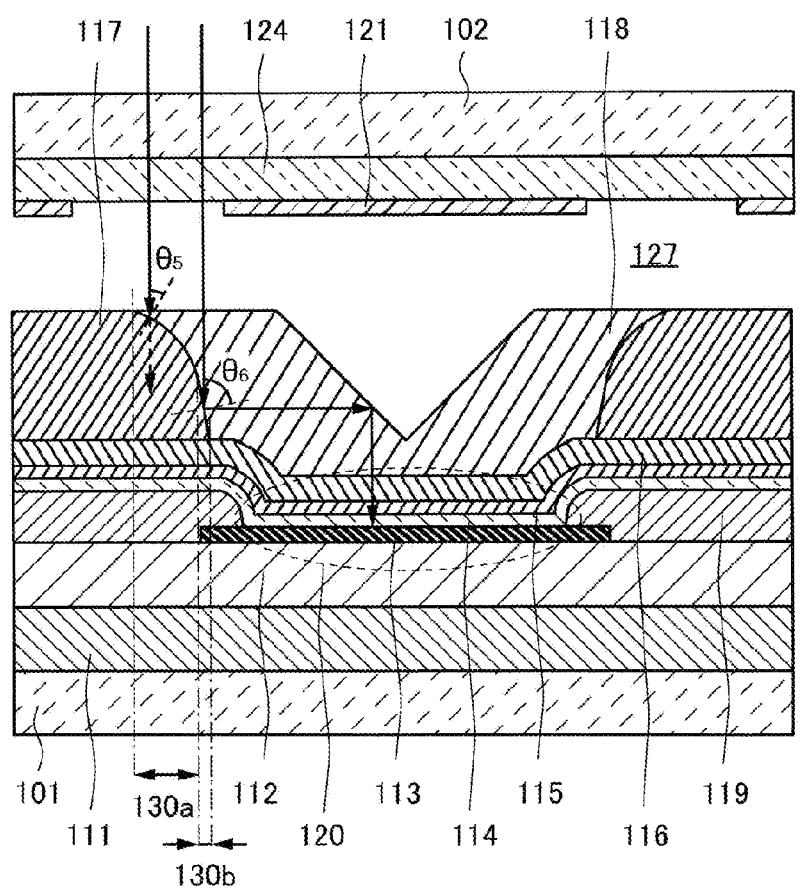
FIG. 18 is a diagram illustrating a configuration of a display device according to an embodiment of the present invention.

The inclined surface of the insulating layer 117 is described here with reference to FIG. 18. Let it be assumed, as shown in FIG. 18, that the angle $\theta_5$ formed by the direction of incidence on the first region 130a of the insulating layer 117 of the light incident vertically downward from outside the display device 200 and the direction perpendicular to a tangent to the point of incidence of the light on the first region 130a of the insulating layer 117 is smaller than the critical angle $\theta c$ at which the light incident vertically downward from outside the display device 200 is totally reflected. Let it also be assumed that the angle $\theta_6$ formed by the direction of incidence on the second region 130b of the insulating layer 117 of the light incident vertically downward from outside the display device 200 and the direction perpendicular to a tangent to the point of incidence of the light on the second region 130b of the insulating layer 117 is equal to or larger than the critical angle $\theta c$ at which the light incident vertically downward from outside the display device 200 is totally reflected.

Such a configuration as that described above allows the light-shielding layer 121 to prevent most of the light incident vertically downward from outside the display device 200 from being incident on the inside of the display device 200. Further, even in the region where the light-shielding layer 121 is not present, the first region 130a of the insulating layer 117 makes it possible to transmit most of the light incident on the inside of the display device 200. This makes it possible to reduce the amount of light that is incident on the inside of the display device 200. Further, even if light is incident on the inside of the display device 200, the amount of light that is reflected by the reflecting electrode can be reduced.

In the configuration of the display device 200 shown in FIG. 16, it is preferable that the first region 130a of the insulating layer 117 and the reflecting electrode (in FIG. 16, the pixel electrode 113) do not overlap each other. This makes it possible, even in a case where light incident from outside the display device 200 passes through the first region 130a of the insulating layer 117, to further reduce reflections of the light on the reflecting electrode.

Such a configuration of the display device 200 makes it possible to reduce extraneous light that penetrates into the display device 200 and reduce the intensity of light that further reflects and emerges from inside. Further, even a structure in which no circularly polarizing plate is bonded to the display device 200 makes it possible to prevent a display image from becoming difficult to view. Further, since it is not necessary to bond a circularly polarizing plate to the display device 200, it is possible to efficiently extract light emitted by the light-emitting elements and to improve the luminance.

The configuration of the insulating layer 118 described in the first embodiment may be applied to the display device 200 according to the present embodiment. That is, the insulating layer 118 may be structured such that its density gradually becomes lower or such that the insulating layer 118 includes a plurality of layers stacked on top of each other.

In order for the light emitted from the light-emitting element 120 to be totally reflected by the insulating layer 117 and the insulating layer 118 of the display device 200 according to the present embodiment, it is preferable that the refractive index of the insulating layer 117 be lower than the refractive index of the insulating layer 118. Reference can also be made here to FIG. 19, which shows a graph representing a relationship between the refractive index n1 of the source of incidence, the refractive index n2 of the destination of travel, and the critical angle θc. In the present embodiment, the refractive index n1 of the source of incidence represents the insulating layer 118, and the refractive index n2 of the destination of travel represents the insulating layer 117. It should be noted that also in a case where light is incident on the display device 200 from outside, the refractive index n1 of the source of incidence represents the insulating layer 118 and the refractive index n2 of the destination of travel represents the insulating layer 117.

The foregoing has described the display devices 100 and 200 according to preferred embodiments of the present invention. However, these are mere examples, and the technical scope of the present invention is not limited to them. A person skilled in the art could have conceived of various modifications without departing from the spirit of the present invention as claimed in the patent claims. Therefore, those modifications should of course be construed as belonging to the technical scope of the present invention.

What is claimed is:

1. A display device, comprising:
a first substrate;
a light-emitting element over the first substrate;
a sealing film located over the light-emitting element and covering the light-emitting element;
a first insulating layer over the sealing film;
a second insulating layer over the sealing film; and
a light-shielding layer overlapping the second insulating layer in a plan view,
wherein the first insulating layer has an opening in a region thereof overlapping a light-emitting region of the light-emitting element in a plan view, the light-emitting region being exposed through the opening,
at least a part of the second insulating layer is located in the opening,
the second insulating layer has a depression in a first region thereof overlapping the light-emitting region in a plan view,
the light-shielding layer is located in a second region overlapping the light-emitting region of the light-emitting element in a plan view, and
a first refractive index of the first insulating layer is lower than a second refractive index of the second insulating layer.

2. The display device according to claim 1, further comprising a second substrate facing the first substrate,
wherein the light-shielding layer is provided to the second substrate.

3. The display device according to claim 1, wherein the depression has an inverted-conical shape or an inverted-pyramidal shape.

4. The display device according to claim 1, wherein the depression has a first inclined surface,
the first insulating layer has a second inclined surface in the opening,
the first inclined surface totally reflects light emitted vertically upward from the light-emitting element with respect to the first substrate, and
the second inclined surface totally reflects light horizontally incident from the first inclined surface.

5. The display device according to claim 1, wherein a density of the second insulating layer becomes lower from a side touching the first insulating layer toward a first inclined surface of the depression.

6. The display device according to claim 1, wherein the second insulating layer includes a first layer and a second layer located on a side of the first layer that faces the light-shielding layer, and
a first density of the first layer is higher than a second density of the second layer.

7. The display device according to claim 1, wherein the first insulating layer contains silicon oxide or organic resin, and
the second insulating layer contains silicon nitride.

8. A display device, comprising:
a first substrate;
a plurality of light-emitting elements over the first substrate;
a sealing film located over the light-emitting elements and covering the plurality of light-emitting elements;
a first insulating layer over the sealing film;
a second insulating layer over the sealing film;
a light-shielding layer overlapping the second insulating layer in a plan view; and
a second substrate over the light-shielding layer,
wherein the first insulating layer has a plurality of openings,
each of the plurality of openings overlaps a light-emitting region of a corresponding one of the plurality of light-emitting elements in a plan view and exposes the light-emitting region,
at least a part of the second insulating layer is located in the opening, the second insulating layer has an inverted-conical or inverted-pyramidal depression in each region thereof overlapping a corresponding one of the light-emitting regions in a plan view, the light-shielding layer has a first region located in a region overlapping the light-emitting region, the light-shielding layer has a second region located in a region between adjacent ones of the plurality of light-emitting elements, and a first refractive index of the first insulating layer is lower than a second refractive index of the second insulating layer.

9. The display device according to claim 8, wherein the second insulating layer has a first inclined surface constituting a half angle of the inverted-conical or inverted-pyramidal depression, the first insulating layer has a second inclined surface in the opening, the first inclined surface totally reflects light emitted vertically upward from the light-emitting element, and the second inclined surface totally reflects light horizontally incident from the first inclined surface.

10. The display device according to claim 8, wherein a density of the second insulating layer becomes lower from a side touching the first insulating layer toward an inclined surface constituting a half angle of the inverted-conical or inverted-pyramidal depression of the second insulating layer.

11. The display device according to claim 8, wherein the second insulating layer includes a first layer and a second layer located on a side of the first layer that faces the light-shielding layer, and a first density of the first layer is higher than a second density of the second layer.

12. A display device, comprising:
a first substrate;
a light-emitting element over the first substrate;
a sealing film located over the light-emitting element and covering the light-emitting element;
a first insulating layer over the sealing film;
a second insulating layer over the sealing film;
a light-shielding layer overlapping the second insulating layer in a plan view; and
a second substrate over the light-shielding layer, wherein the first insulating layer has an opening in a region thereof overlapping a light-emitting region of the light-emitting element in a plan view, the light-emitting region being exposed through the opening, at least a part of the second insulating layer is located in the opening, the second insulating layer has an inverted-conical or inverted-pyramidal depression in a region thereof overlapping the light-emitting region in a plan view, the light-shielding layer is located in a region overlapping the light-emitting region of the light-emitting element in a plan view, the second insulating layer has a first inclined surface constituting a half angle of the inverted-conical or inverted-pyramidal depression, the first insulating layer has a second inclined surface in the opening, the first inclined surface totally reflects light emitted vertically upward from the light-emitting element, the second inclined surface has a first region that totally reflects light horizontally incident from the first inclined surface and a second region that transmits the light totally reflected by the first inclined surface, and a first width of the first region as viewed in cross-section is larger than a second width of the second region as viewed in cross-section.

13. The display device according to claim 12, wherein a first refractive index of the first insulating layer is lower than a second refractive index of the second insulating layer.

14. The display device according to claim 12, wherein a density of the second insulating layer becomes lower from a side touching the first insulating layer toward an inclined surface constituting a half angle of the inverted-conical or inverted-pyramidal depression of the second insulating layer.

15. The display device according to claim 12, wherein the second insulating layer includes a first layer and a second layer located on a side of the first layer that faces the light-shielding layer, and a first density of the first layer is higher than a second density of the second layer.

* * * * *